United States Patent [19]

Christopher

[11] Patent Number: 4,764,967
[45] Date of Patent: Aug. 16, 1988

[54] TONE CONTROL SYSTEM FOR SAMPLED DATA SIGNALS

[75] Inventor: Todd J. Christopher, Indianapolis, Ind.

[73] Assignee: RCA Licensing Corporation, Princeton, N.J.

[21] Appl. No.: 73,338

[22] Filed: Jul. 13, 1987

Related U.S. Application Data

[63] Continuation-in-part of Ser. No. 923,416, Oct. 27, 1986, abandoned.

[51] Int. Cl.$^4$ ............................................. H03G 5/00
[52] U.S. Cl. ...................................... 381/98; 364/724
[58] Field of Search ....................... 333/14, 165, 166; 364/724; 381/98, 103, 101, 106

[56] References Cited

U.S. PATENT DOCUMENTS

| | | | |
|---|---|---|---|
| 4,055,818 | 10/1977 | Gay | 381/101 |
| 4,317,092 | 2/1982 | Potter | 333/165 |
| 4,562,591 | 12/1985 | Stikvoort | 381/106 |
| 4,580,237 | 4/1986 | Eggermont | 364/724 |
| 4,629,995 | 12/1986 | Katakura | 333/14 |
| 4,694,414 | 9/1987 | Christopher | 364/724 |

FOREIGN PATENT DOCUMENTS 1385024 2/1975 United Kingdom .
2076263 11/1981 United Kingdom ................ 381/106

OTHER PUBLICATIONS

Y. Hirata, "Simple Digital Filter for Sound Reproduction", Wireless World, Sep. 1982, pp. 77–79.
J. L. Hood, "Modular Preamplifier", Wireless World, Nov. 1982, pp. 60–66.
D. Self, "Precision Preamplifier", Wireless World, Oct. 1983, pp. 31–39.

Primary Examiner—Forester W. Isen
Attorney, Agent, or Firm—Eugene M. Whitacre; Paul J. Rasmussen; Eric P. Herrmann

[57] ABSTRACT

A sampled data tone control system, applicable for providing audio bass cut and boost control, includes a single variable multiplying circuit for determining the system variable response characteristics. Input samples are coupled to the multiplier which has its output connected to an integrator. The integrated samples are scaled by a constant and combined with the input samples to provide tone controlled signal.

10 Claims, 5 Drawing Sheets

CONSTANT BANDWIDTH
RESPONSE

VARIABLE BANDWIDTH
RESPONSE

TONE CONTROL SYSTEM FOR SAMPLED DATA SIGNALS

This application is a continuation-in-part of application Ser. No. 923,416 filed Oct. 27, 1986 (now abandoned).

This invention relates to circuitry for performing tone control of sampled data signals, as for example, in pulse code modulated (PCM) audio processing apparatus.

BACKGROUND OF THE INVENTION

A digital sampled data tone control circuit for tailoring the bass response of audio signals is described by Richard J. Taylor in the British Patent Specification G.B. No. 1,385,024. This circuitry includes a low-pass filter for passing the bass spectrum of the audio signals, a multiplier coupled to the output of the low-pass filter for scaling the low-pass filtered audio signal, and combining circuitry for adding or subtracting the bass spectrum of the audio signal to the input audio signal. The combined signal represents the audio signal with the bass portion of the audio signal spectrum either boosted or cut depending on whether the low-pass filtered signal is added or subtracted from the input audio signal respectively. The degree of boost or cut is determined by the multiplication coefficient applied to the multiplier. If the low-pass filter has a fixed frequency response (that is a fixed 3 dB point) and is desirably of relatively simple design (rolls off at 6 or 12 dB per octave), adjusting the cut or boost has the undesirable affect of altering the bandwidth of the bass spectrum affected. For example, consider the low-pass filter to have a 3 dB point (a zero) of 1 kHz and a roll off of 20 dB per decade. For a bass boost or cut of 20 dB, the bandwidth of the bass spectrum affected extends to approximately 10 KHz. However, for a bass boost or cut of 1 dB, the bandwidth of the bass spectrum affected is approximately 1 KHz. To preclude such bass spectrum variations with the degree of boost or cut, the 3 dB frequency of the low-pass filter must be adjusted simultaneously with the change in multiplication coefficient. In order to satisfy this requirement, the low-pass filter will typically incorporate variable gain control elements which undesirably complicates the circuitry.

Yoshimutsu Hirata described a slightly more complicated tone control circuit for adjusting bass response at pages 77–79 of the September 1982 issue of Wireless World in the article entitled "Simple Digital Filters For Sound Reproduction". This tone control circuit includes the cascade connection of a variable finite impulse response filter and a variable infinite impulse response filter, both of which include multiplier elements. Bass boost or cut is effected by applying respective multiplying coefficients to the multiplier elements of the cascade connected filters. With proper selection of the multiplier coefficients, the bandwidth of the bass spectrum affected by boost and cut is maintained relatively constant.

It is an object of the present invention to provide a relatively versatile tone control circuit which may be conditioned to have a frequency response similar to either the Taylor apparatus or the Hirata apparatus, but which requires a single variable multiplier circuit. It is desirable to minimize the number of variable multiplier elements since they tend to be relatively complex and expensive circuit elements.

SUMMARY OF THE INVENTION

The present invention is a tone control circuit for providing boost or cut to a portion of the frequency spectrum of applied signals. The circuit performs a transfer function characterized by having poles and zeroes and is selectable to have fixed zeroes and at least one variable pole to perform boost or by having fixed poles and at least one variable zero to perform cut. The circuitry includes a multiplier responsive to a variable multiplier coefficient G to determine the position of the variable pole or variable zero relative to the corresponding fixed zeroes or poles respectively.

The multiplier is serially coupled with a transfer function circuit having a frequency response established by a scaler constant. An input signal is coupled to the input to the multiplier. The input signal is combined with an output signal from the transfer function circuit to produce a tone controlled signal.

In accordance with an aspect of the invention, when it is desired that the bandwidth of the low frequency spectrum to be cut or boosted remain relatively constant, the fixed pole/zero is established at the upper limit of the low frequency spectrum, for example, 1000 Hz. In this instance, the gain factor G is varied from a value of 1 for a flat frequency response, to factors, G, less than 1 for greater degrees of cut or boost.

Alternatively, in accordance with an aspect of the invention, when it is desired that the low frequency processed signal spectrum expand with greater degrees of cut or boost, the fixed pole/zero is established at a low frequency, for example, 70 Hz. In this instance, the gain factor, G, is varied from 1 for a flat frequency response to values greater than 1 for greater degrees of cut or boost.

DETAILED DESCRIPTION

Figure 1:
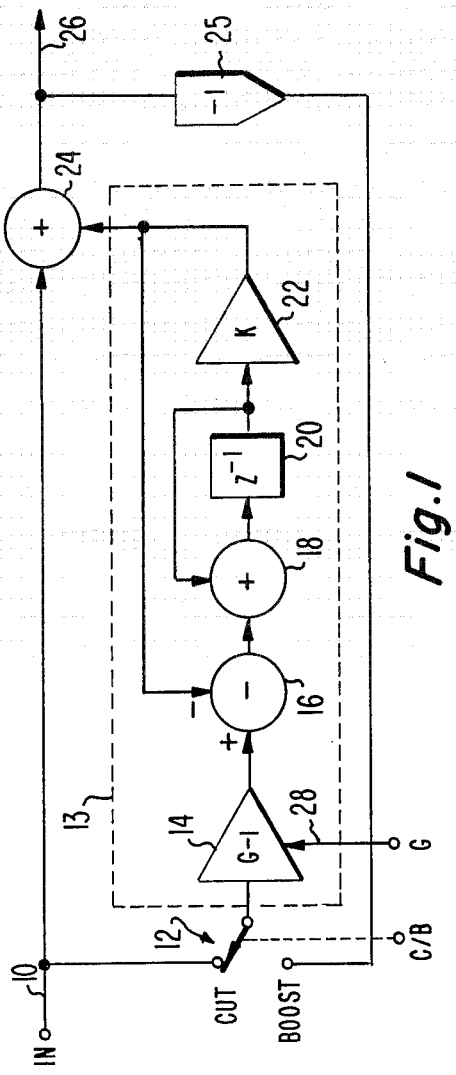
FIG. 1 is a block diagram of a generalized tone control system embodying the present invention.

FIG. 1 illustrates the tone control circuit of the present invention which is applicable, with appropriate choice of circuit elements, to processing serial-bit or parallel-bit digital signals or sampled data analog signals. In the FIG. 1 circuit, compensating delays may be required between certain circuit elements depending upon the processing speed of respective circuit elements and the sample rate of the applied signals. One skilled in the art of circuit design will readily recognize where such compensating delays may be required and be able to include them in his particular circuitry.

The FIG. 1 tone control circuit is arranged to cut or boost the low frequency response of applied signals. The signal to be processed is applied to input terminal 10 and coupled to one input terminal of adder 24 and one input of switch 12. The processed signal from the output terminal 26 of the adder 24 is coupled to a second input terminal of the switch 12 via the signal inverter 25. The switch 12 couples the input signal from terminal 10 to circuitry 13 if low frequency (bass) cut or attenuation is desired and couples the output from adder 24 to circuitry 13 if low frequency boost or emphasis is desired. The output produced from circuitry 13 is coupled to a second input terminal of adder 24. A gain control signal, G, is coupled via conductor 28 to the circuitry 13, which circuitry determines the degree of low frequency cut or boost. The circuitry 13 performs the transfer function $T_{13}$ given by $$T_{13} = (G-1)K/(Z-1+K) \quad (1)$$

where Z is the conventional Z-transform variable, K is a scaler constant selected to determine the nominal bandwidth of the cut or boosted low frequency spectrum and G is the cut or boost attenuation/gain factor.

Circuitry 13 includes a gain element 14 which has its input terminal coupled to the switch 12 and a control input terminal for applying the cut/boost control signal, G. The gain element 14 multiplies the signal applied to its input by the quantity (G−1). The output signal produced by the gain element 14 is coupled to the minuend input terminal of a signal subtracter 16, the subtrahend input terminal of which is coupled to the output connection of circuitry 13. The output terminal of subtracter 16 is coupled to the input terminal of an integrator consisting of the adder 18 and delay element 20. Delay element 20 has input and output terminals respectively coupled to the output and second input terminals of adder 18, and delays signal samples by one sample period.

The output from the integrator is coupled to the scaling circuit 22 which scales samples from the integrator by a constant K. The output terminal of the scaling circuit 22 is the output connection of the circuitry 13.

When the switch 12 couples the input terminal 10 to the circuitry 13, the transfer function $T_C$ of the circuitry between input terminal 10 and output terminal 26 may be represented by $$T_C = [G + (Z-1)/K]/[1 + (Z-1)/K]. \quad (2)$$

This function has a fixed pole at Z=(1−K) which in the frequency domain is approximated by $$f_p = K/2\pi T \quad (3)$$

where T is the sample period and provided that $2\pi fT$ is much less than one f being the signal frequency). For audio signals, this latter condition is satisfied if the sample rate is five or more times the audio bandwidth.

The transfer function of equation (2) has a single zero which is variable and occurs at Z=1−GK or $$f_o = GK/2\pi T. \quad (4)$$

Low frequency boost is attained by coupling the output from adder 24 to the circuit 13. The transfer function $T_B$ for the circuitry between input terminal 10 and output terminal 26 is $$T_B = [1 + (Z-1)/K]/[G + (Z-1)/K]. \quad (5)$$

This function has a fixed zero at Z=1−K and an adjustable pole at Z=1−GK. The transfer function $T_B$ is symmetric with the function $T_C$ about the flat frequency response.

For a gain factor, G, equal to one, the pole and zero are coincident and the transfer function reduces to the factor 1.

In accordance with an aspect of the invention, when it is desired that the bandwidth of the low frequency spectrum to be cut or boosted remain relatively constant, the factor K is selected so that the fixed pole/zero is established at the upper limit of the low frequency spectrum, for example, 1000 Hz. In this instance, the gain factor G is varied from a value of 1 for a flat frequency response, to factors, G, less than 1 for greater degrees of cut or boost.

Figure 4A:
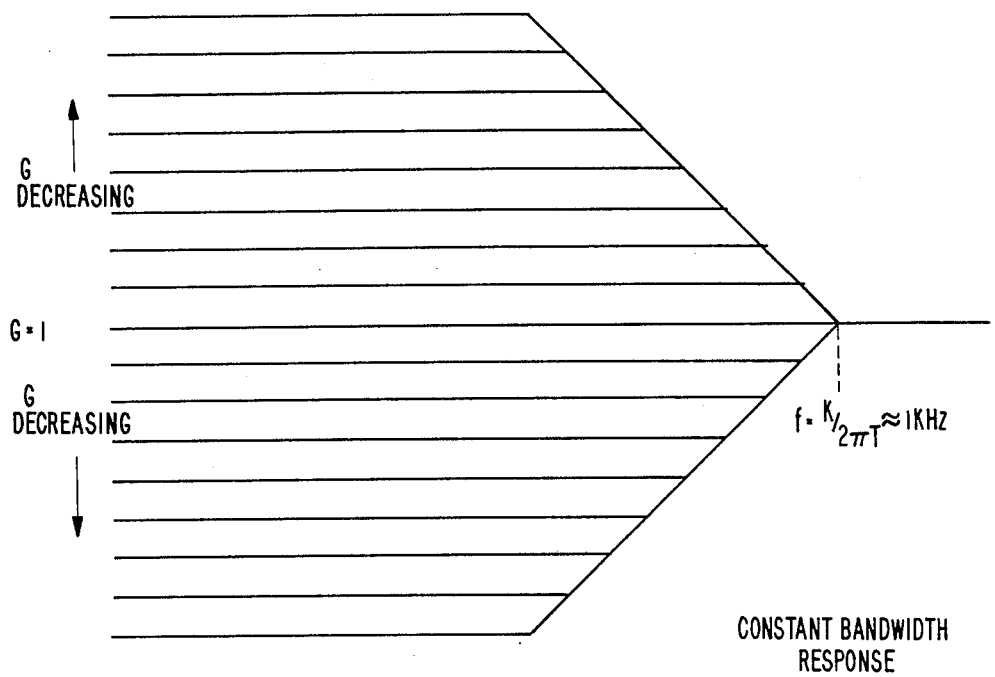
FIGS. 4A and 4B are diagrams of the frequency response of the FIG. 1 system.
Figure 4B:
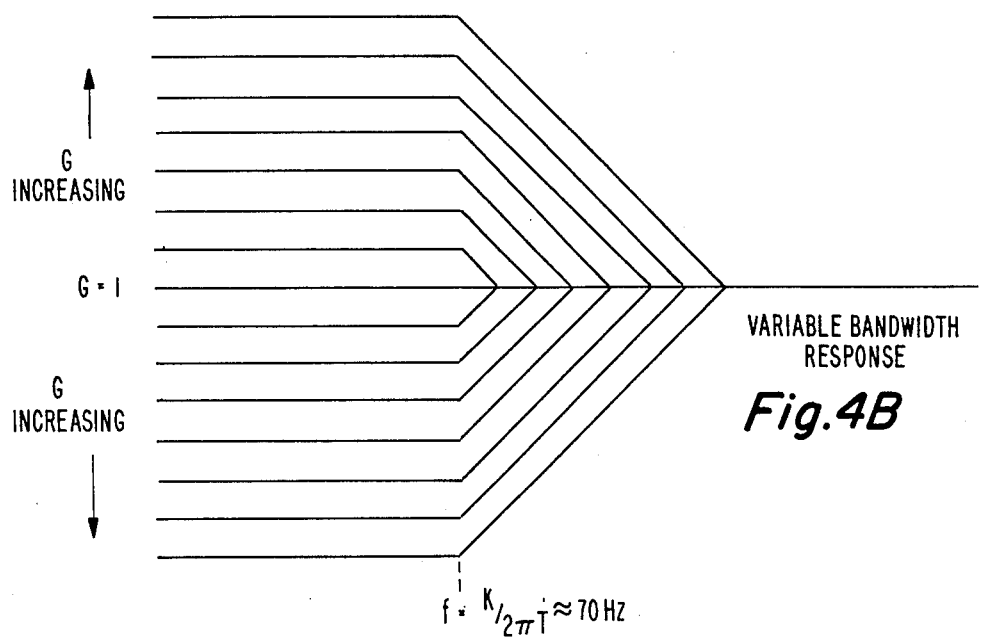

Alternatively, in accordance with an aspect of the invention, when it is desired that the low frequency processed signal spectrum expand with greater degrees of cut or boost, the fixed pole/zero is established at a low frequency, for example, 70 Hz. In this instance, the switch 12 is conditioned to couple the input terminal 10 to the circuitry 13 for boost and is conditioned to couple signal from adder 24 to the circuitry 13 for cut. In addition, the gain factor, G, is varied from 1 for a flat frequency response to values greater than 1 for greater degrees of cut or boost. The transfer function defined by equations (2) and (5) for this arrangement become the transfer function for boost and cut, respectively. The generalized form of the alternate frequency responses is illustrated in FIGS. 4A and 4B.

Figure 2:
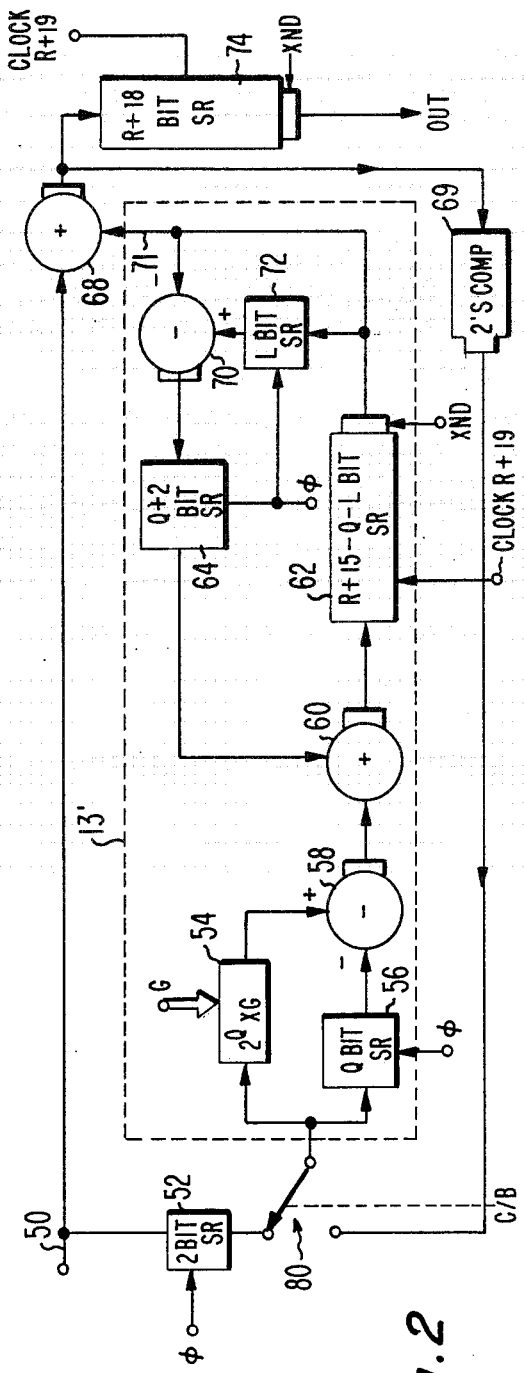
FIG. 2 is a block diagram of a serial-bit implementation of the tone control system illustrated in FIG. 1.
Figure 3:
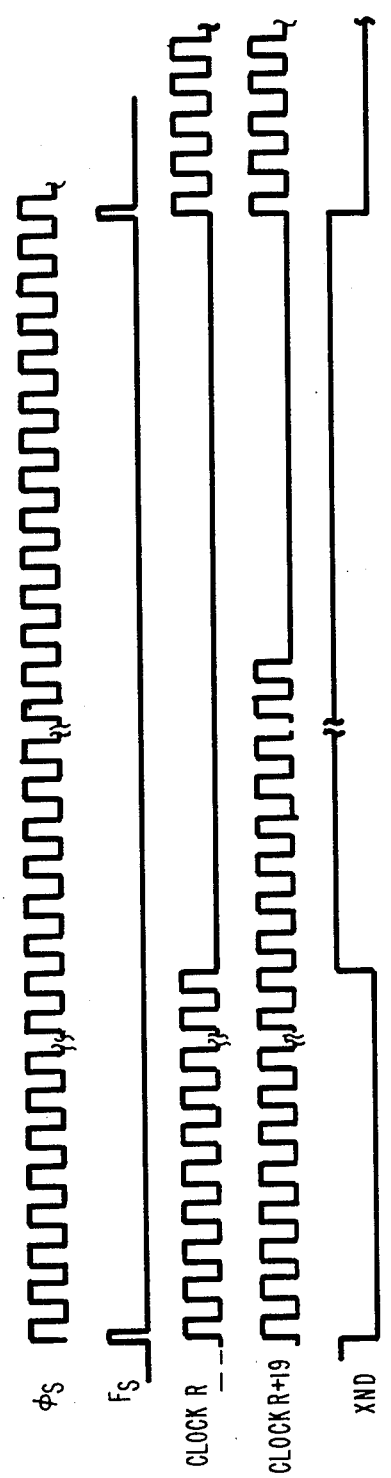
FIG. 3 is a timing diagram of clock waveforms useful in describing the FIG. 2 circuitry.

FIG. 2 is a serial-bit implementation of the FIG. 1 system and will be described with reference to the waveforms of FIG. 3. The FIG. 2 embodiment is arranged to process two's complement binary samples which have the least significant bits, LSB's, of successive samples occurring first in time and sign bits occurring last. The samples are presumed to be R-bits wide. The system includes sign-extend shift registers 62 and 74, which include an output stage responsive to a control signal designated XND, to replicate the bit output by the register occurring immediately before the transition of the signal XND. The signal XND, illustrated in FIG. 3, is timed to capture and replicate the sign or Rth bit of each sample, from its occurrence until the end of the sample period. The sign extend function may be implemented with a transparent latch, such as the SN74LS373, coupled in series with the output of a conventional serial-bit shift register.

The signal samples occur synchronously at a rate defined by the sample clock designated $F_s$. Successive bits of each sample occur at a rate defined by the system clock designated $\phi_s$.

The adders and subtracters in the FIG. 2 system are presumed to impose a one bit-period processing delay to the combined signals processed in the respective elements.

Figure 5:
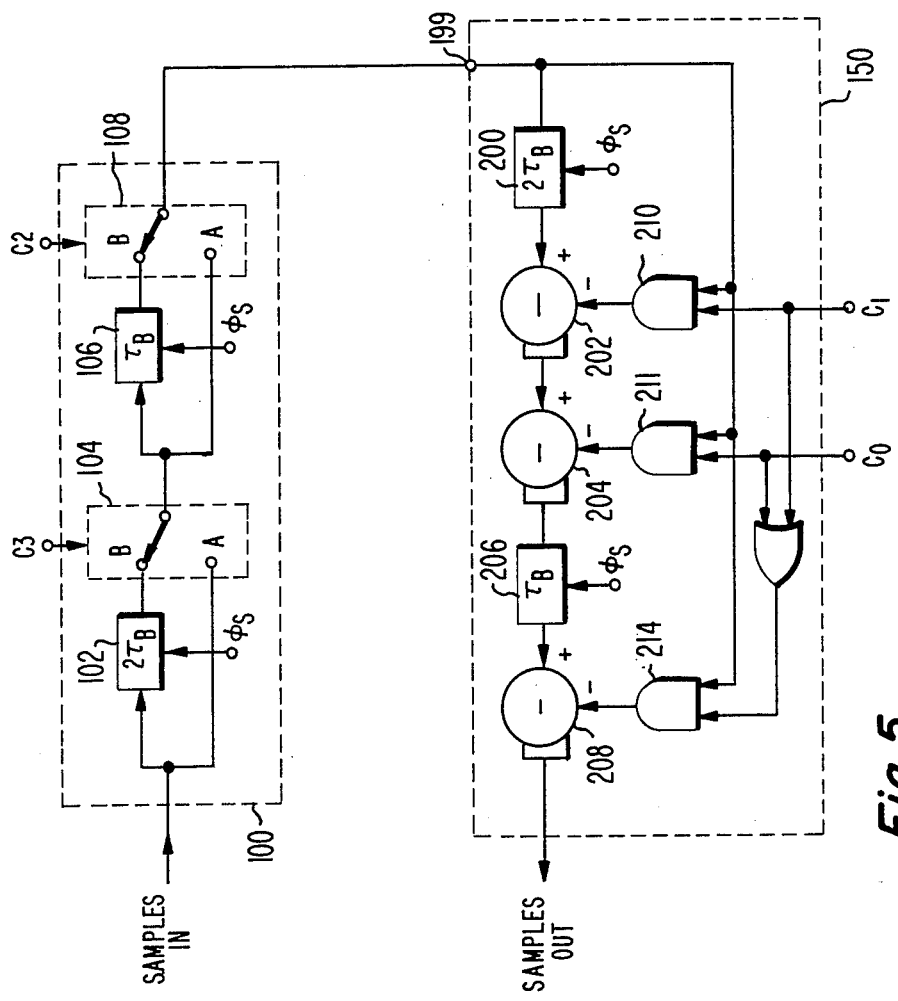
FIG. 5 is a partial block, partial schematic diagram of a serial-bit multiplier which may be implemented in the FIG. 2 circuitry.

The serial-bit multiplier 54, an example of which will be described with reference to FIG. 5, is presumed to have a processing delay of Q bit-periods. Those persons skilled in the art of serial-bit digital signal processing will recall that for each bit-period of delay or advancement a serial-bit sample undergoes, it is respectively multiplied or divided by a factor of two relative to a non-delayed or a non-advanced sample. Thus, if multiplier 54 imposes processing delay of Q bit periods, the scale factor applied to samples passed through the multiplier is actually $G \times 2^Q$.

The principal that serial-bit samples are multiplied or divided by factors of 2, by delaying or advancing the samples, is utilized in the FIG. 2 embodiment to perform scaling by the constant factor K, which in the illustrated example equals $2^{-L}$.

Serial-bit input samples are applied to terminal 50 with the sample bits occurring coincident with the pulses of clock R (the form of clock R being illustrated in FIG. 3). The input sample is applied to one input terminal of adder 68. Coincident with the LSB and subsequent bits of the input sample being applied to terminal 50, the LSB and subsequent bits of a sample are provided at the output connection, 71, of circuitry 13'. The output samples from circuitry 13' are clocked out of the shift register 62 by clock (R+19). Output samples from shift register 62 are directly coupled to a second input terminal of adder 68. The samples provided by shift register 62 represent samples processed by the circuitry 13' which have been scaled by a factor K equal to $2^{-L}$. The tone controlled samples from adder 68, multiplied by 2 by virtue of the processing delay of the adder 68, are coupled to the input terminal of the (R+18)-bit shift register, 74, and clocked into the register by a signal clock (R+19) having bursts of (R+19) clock pulses. This clock signal having one more pulse than the number of bits of the register 74 divides the output samples from adder 68 by 2, to properly justify or renormalize the output samples.

A two bit period delay register 52 is coupled between the input terminal 50 and switch 80 (which corresponds to switch 12 in FIG. 1). Delay element 52 is included in the input path to switch 80 to compensate for the processing delay of adder 68 and the two's complement inverter 69 in the feedback path to switch 80. Thus, whether the system input or output samples are coupled to circuitry 13', they are multiplied by a factor of four. Input samples to circuitry 13' are applied to the serial input terminal of a multiplier 54 which has a processing delay of Q bit-periods. Output samples from multiplier 54, multiplied by $G \times 2^Q$ are coupled to the minuend input terminal of subtracter 58. The input samples to circuitry 13' are also applied to a Q-bit delay register 56, the output of which is coupled to the subtrahend input terminal of subtracter 58. Delay register 56 compensates for the Q-bit processing delay of multiplier 54, and imparts a gain of $2^Q$ to the input samples. The output samples from subtracter 58 are equal to $2^3 \times 2^Q \times (G-1)$ times the value of the samples applied to the input terminal 50. The output terminal of subtracter 58, which corresponds to the output of the gain element 14 in FIG. 1, is coupled to a first input terminal of adder 60. The output terminal of adder 60 is coupled to the input terminal of shift register 62.

Shift register 62 in FIG. 2 corresponds to the delay element 20 of FIG. 1. The samples applied to the delay element, 20, comprise the sum of (1−K) times the output of the delay element, 20, plus the output of the multiplier 14. The factor K is equal to $2^{-L}$ in the FIG. 2 embodiment.

In FIG. 2 the input to the shift register 62 (delay element) is provided by adder 60. One input to adder 60 is the output of subtracter 58 which provides input samples multiplied by $(G-1) 2^{Q+3}$. The other input to adder 60 is a feedback signal from shift register 62. However, since the samples from subtracter 58 are modified by an excess gain factor $2^{Q+3}$, so also must the feedback signal from shift register 62.

The output samples, $S_D$, from shift register 62 are coupled directly to the subtrahend input of subtracter 70, and are coupled to the minuend input of subtracter 70 via an L-bit shift register 72. The output, $O_S$, of subtracter 70 is:

$$O_S = 2(2^L S_D - S_D) \quad (6)$$
$$= 2(2^L - 1)S_D \quad (7)$$

The samples $S_D$ from register 62 are samples, $S_I$, input to register 62 from adder 60 scaled by the factor $2^{-L}$. Therefore samples $S_D = 2^{-L} S_I$ and the samples $O_S$ may be described by the equation:

$$O_S = 2(1-2^{-L}) S_I \quad (8)$$

or $$O_S = 2(1-K) S_I \quad (9)$$

The output samples produced by subtracter 70 are coupled to the second input terminal of adder 60 by a compensating shift register 64. Shift register 64 is interposed to equilibrate the gain factor of the samples provided by subtracter 70 with the excess gain factor of $2^{Q+3}$ of the samples provided by subtracter 58. Thus, shift register 64 is arranged to provide a delay of (Q+2) bit periods.

The samples coupled to shift register 62 from adder 60 have an excess gain of $2 \times 2^{Q+3}$ or $2^{Q+4}$ where the additional factor of 2 arises from the processing delay in adder 60.

The gain factor of $2^{Q+4}$ is manifested as a Q+4 bit delay of the samples provided from adder 60. Thus the LSB of each sample from adder 60 does not occur until the (Q+4)th clock pulse. An additional R clock pulse must occur before the R-bit sample is fully output from adder 60. If the signal CLOCK (R+19) is used to clock the sample from adder 60 into the shift register 62, so that the LSB of the sample is resident in the output stage of the shift register at the (R+19)th clock pulse, then shift register 62 must contain R+(19−[Q+4]) or R+15−Q stages. However, in order to scale the samples applied to register 62 by the factor $2^{-L}$, the shift register is constructed with L less stages or R+15−Q−L stages. This has the effect of shifting the bits of the samples applied to the shift register to L lesser significant bit positions.

The FIG. 2 circuit performs the same function on serial bit sampled data signals as the generalized FIG. 1 circuit performs on, for example, parallel bit digital sampled data signals with the limitation that, as illustrated, the FIG. 2 circuitry is only capable of scaling the output samples from shift register 62 by factors K which are integer powers of 2. However, the elements 64, 70 and 72 may be replaced with more general multiplier circuitry if K factors of more precise resolution are desired.

FIG. 5 illustrates a serial-bit gain element which may be used for the multiplier 54 in the FIG. 2 circuitry. The FIG. 5 gain element has a range of 22.6 dB and changes in 1.5 dB increments. The maximum gain factor is $2^9$. Thus, if Q is set equal to 9, the effective gain of the FIG. 5 gain element employed in the FIG. 2 system will have a range from 1 (0 dB) to $38 \times 2^{-9}$ in 1.5 dB steps.

The gain element includes a coarse gain multiplier/divider 100 and a fine multiplier/divider 150. The coarse multiplier/divider is controlled by the two logic signals C3 and C2 and has a gain resolution of 6 dB per step. The fine multiplier divider 150 is controlled by the two logic signals C1 and C0 and multiplies the output of the coarse multiplier/divider by one of the four values 38, 46, 54 and 64. The differences between successive ones of an ascending sequence of these values is approximately 1.5 dB, which difference determines the gain resolution of the fine multiplier/divider.

The coarse multiplier/divider 100 includes the cascade connection of delay register 102, multiplexer 104, delay register 106 and multiplexer 108. Delay registers 102 and 106 delay samples applied thereto by two and one bit delays respectively. The multiplexers are arranged so that for control signals C3 and C2 concatinated and having logic values C3C2 equal to 00, 01, 10 and 11, the coarse multiplier/divider delays the input samples by 3, 2, 1 and no bit delays respectively. Thus, for the control values C3C2 equal to 00, 01, 10 and 11 the coarse multiplier/divider provides gain of $2^3$, $2^2$, $2^1$ and $2^0$ respectively.

The fine multiplier/divider 150 includes a cascade connection of a delay register 200, a first subtracter 202, a second subtracter 204, a delay register 206 and a third subtracter 208. The subtrahend input terminals of the first, second and third subtracters are coupled to the input terminal, 199, of the fine multiplier/divider via gating circuits 210, 211 and 214 respectively. Gating circuit 210 is enabled whenever the control signal C1 is a logic one; gating circuit 211 is enabled whenever control signal C0 is a logic one; and gating circuit 214 is enabled whenever either control signal C0 or C1 is a logic one.

Delay elements 200 and 206 provide delays of two and one bit periods respectively. Each of the three subtracters is assumed to have a processing delay of one bit period. If the gating circuits 210, 211 and 214 are all disabled (concatenated control signal C1C0 equal to 00) the fine multiplier/divider 150 simply delays samples by 6 bit periods and provides a gain of $2^6$. Therefore, if all of the control signals C3, C2, C1 and C0 are logic zeroes, the gain of the combination coarse and fine multiplier/divider is $2^3 \times 2^6$ or $2^9$.

Consider control signal C1 to be a logic high and control signal C0 a logic low. Under these conditions gating circuits 210 and 214 are enabled and gating circuit 211 is disabled. Gating circuit 210 couples the input sample at terminal 199 to the subtrahend input of subtracter 202. The minuend input to subtracter 202 is coupled to the input terminal 199 by delay register 200 and is equal to the input sample, at terminal 199, multiplied by $2^2$ by virtue of the two bit delay register 200. The output of subtracter 202, under this condition, is $2 \times (2^2-1)$ times the input sample. The minuend input to subtracter 208 is equal to the output from subtracter 202 multiplied by four by virtue of the one-bit delays imparted by elements 204 and 206. The subtrahend input to subtracter 208 is the input sample. The output produced by subtracter 208 for control signal C1=logic high is the input sample multiplied by $2 \times [8 \times (2^2-1)-1]$ or 46.

Alternatively, if gating circuit 211 is also enabled (control signals C1 and C0 both equal to logic ones) then subtracter 204 is conditioned to subtract the input sample at terminal 199 from the output of subtracter 202. The output of subtracter 204 is $2[2(2^{-2}-1)-1]$ times the input sample. The input sample is subtracted from two times this value by subtracter 208 which produces an output value of $2\{4[2(2^{-2}-1)-1]-1\}$ or 38 times the input sample.

Finally for gating circuits 214 and 211 enabled and gating circuit 210 disabled (control signals C0 and C1 equal to logic one and zero respectively), the input sample is subtracted from $2^3$ times the input sample in subtracter 204. The output of subtracter 204 is $2(2^3-1)$ times the input sample. This value is multiplied by 2 by virtue of the delay of register 206 and applied to subtracter 208. Subtracter 208 subtracts the input sample value from the value produced by subtracter 204 to produce the value $2[2 \times 2(2^3-1)-1]$ or 54 times the input sample. If the control signals C1 and C0 are concatinated to form the control signal C1C0, then for the values of C1C0 equal to 00, 01, 10 and 11 the gain provided by the fine multiplier/divider 150 is 64, 54, 46 and 38 respectively. Next consider the control signals C3, C2, C1 and C0 concatinated to form the control signal C3C2C1C0 and consider this signal to vary in a binary ascending format, i.e. from 0000 to 1111 in binary unit steps.

The total gain for unit increments of the combined control signal from 0000 to 1111 forms the sequence $2^3 \times (64, 54, 46, 38)$, $2^2 \times (64, 54, 46, 38)$, $2^1 \times (64, 54, 46, 38)$, $2^0 \times (64, 54, 46, 38)$. The maximum gain is $2^3 \times 64$ or $2^9$ and the minimum gain is 38. If these factors are represented in the form $2^Q \times G$ where Q is set equal to 9 the sequence, G, for the multiplier becomes $2^{-6} \times (64, 54, 46, 38)$, $2^{-7} \times (64, 54, 46, 38)$, $2^{-8} \times (64, 54, 46, 38)$, $2^{-9} \times (64, 54, 46, 38)$, which corresponds to a maximum value of G, of one (or zero dB) and which decreases in approximate 1.5 dB steps to a minimum value of G of $2^{-9} \times 38$ or $-22.59$ dB.

The control signal C3C2C1C0 may be generated by a microprocessor controller if it is desired that gain values be provided in random sequences. Alternatively, if it is desired that the gain values incrementally increase or decrease, the control signal C3C2C1C0 may be provided by the parallel output of a selectively energized binary up-down counter.

Figure 6:
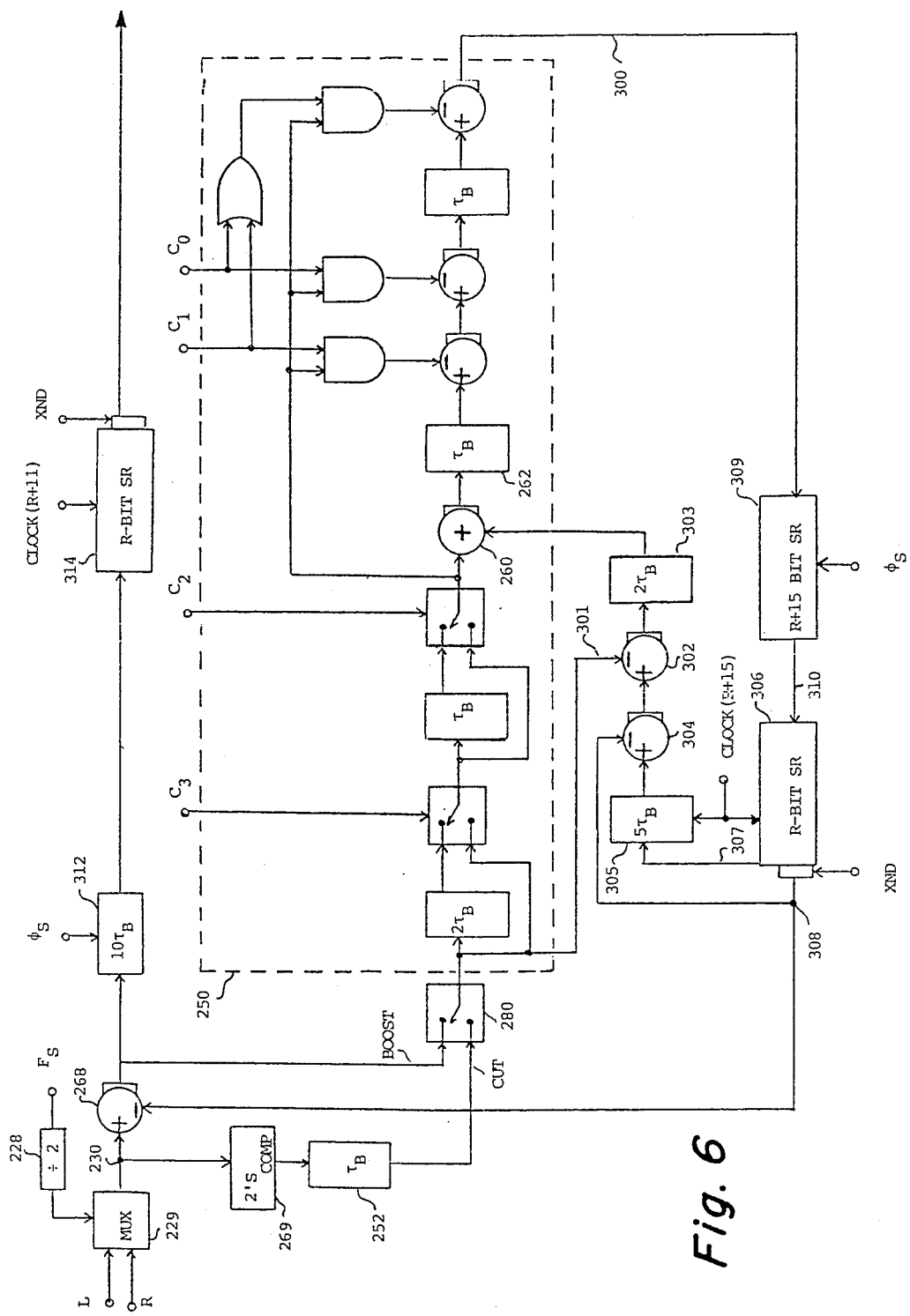
FIG. 6 is a block diagram of a further serial-bit implementation of a tone control system.

FIG. 6 illustrates a tone control system using the FIG. 5 gain element wherein some of the integrator elements are incorporated integrally with the gain element. In addition the FIG. 6 embodiment includes an additional delay stage to accommodate processing time division multiplexed audio signal. The time division multiplexed audio signal is formatted for example as alternating samples of right channel signal R and left channel signal L.

The sample bit width is against presumed to be R-bits wide. However in this instance the sample interval is assumed to contain 35 pulses of the system clock $\phi_s$.

In FIG. 6, the combining element 268, which corresponds to combining element 68 in FIG. 2, is a subtractor rather than an adder. The reason for this change is the fact that in the FIG. 6 embodiment it is more convenient to place the two's complementing circuit 269 between the signal input and the gain element than between the output of the combining element 68 and the switch 80 as in FIG. 1. In addition the shift register 252, which corresponds to shift register 52 in FIG. 1, is reduced to a one bit delay.

Two serial-bit signals, L and R, each of which occur at a sample rate of $F_s/2$ are coupled to respective input terminals of a 2-to-1 multiplexer 229. These two signals are time division multiplexed (alternated) and coupled to the tone control input 230 under the control of the sample clock $F_s$ via the divide by two frequency divider 228. The multiplexed signals are complemented in the two's complementing circuit 229, delayed by one bit period in register 252 and coupled to the gain element 250 via switch 280. If the multiplexed signal is designated MS, the samples applied to the gain element 250 are equal to $-2$ MS due to the inversion and delay imposed by elements 269 and 252. The samples $-2$ MS are scaled in the gain element 250 and provide a first contribution to the signal available at the output connection 300 of the gain element, equal to $-2$ MS ($2^9 \times G$). Note gain element 250 is similar to the circuitry described with respect to FIG. 5. The difference between the gain elements of FIGS. 6 and 5 is that an adder 260 and a one bit period delay element 262 (in FGIURE 6) have been substituted for the delay element 200 in FIG. 5, which provides a delay of two bit periods. For samples passing serially through the gain element 250, from input to output, the adder 260 and delay element 262 function as a delay element of two bit periods. Thus for samples passing serially through the gain element 250, it performs exactly as the gain element of FIG. 5 and scales samples by $2^9 \times G$.

The signal $-2$MS is also coupled via switch 280 and connection $-301$ to the subtrahend input of the subtracter 302. Subtracter 302, in effect complements the signal $-2$MS and delays it by one bit period to produce a signal component at its output equal to $2^2$MS. This component is coupled to the two bit period delay element 303 the output of which is coupled to adder 260. Between the delay element 303 and the output connection 300 of the gain element, this signal component incurs an additional delay of six bit periods. The signal $-2$MS is inverted and scaled by $2^9$ to produce a second contribution to the signal available at connection 300 of $+2$MS$\times 2^9$. The sum of the first and second contribution is $-$MS$\times 2^{10}(G-1)$.

There is a third contribution to the signal available at connection 300 which is provided by the minuend input of subtrater 302 and is derived as follows. Shift register 306 is an R stage sign-extend register clocked by a clock signal having (R+15) pulses. The output signal (designated A), available on connection 308 is delayed relative to the input signal (designated B) to register 306 by one sample period and scaled by $2^{-15}$ or B=$2^{15}$AZ. A second output signal avaiable on connection 307 is taken from register 306 immediately ahead of the sign-extend latch. This second output signal has the same value as the signal A but is not truncated by the overclocking of register 306. The signal on connection 307 is delayed 5 bit periods (multipled by $2^5$) in delay element 305 and coupled to subtracter 304 and the signal available on connection 308 is applied directly to subtracter 304 the output of which is equal to $2A(2^5-1)$. Between the output of subtracter 304 and output connection 300 this signal undergoes a delay of 9 bits periods (multiplied by $2^9$) and forms a contribution to the signal on connection 300 equal to $2^{10}A(2^5-1)$. The total signal on connection 300 is $2^{10}A(2^5-1)-2^{10}MS(G-1)$. This signal is coupled to the input of register 306 via register a register 309 having 35 stages and which is clocked by the system clock $\phi_s$. If we ignore register 309 then the signal B=$2^{15}$AZ at the input to register 306 is equal to $2^{10}A(2^5-1)-2^{10}MS(G-1)$. Solving for the transfer function A/MS of the circuitry described it can be shown to be equal to $$A/MS = -2^{-5}(G-1)/(Z-1+2^{-5}) \quad (10)$$

which function is in the form of equation (1) but of opposite polarity. The polarity difference is accounted for by the subtractive combining circuit 268.

The input signal MS and the signal A are coupled to combining circuit 268 which develops the signal 2(MS$-$A). The transfer function 2(MS$-$A)/MS is given by $$2(MS-A)/MS = 2(G+(Z-1)/2^{-5})/(1+(Z-1)/2^{-5}) \quad (11)$$

which is a specific example of the transfer function defined by equation (2). The signal 2(MS$-$A) is delayed 10 bit periods (multiplied by $2^{10}$) in register 312 and then clocked into the R stage sign-extend register 314 with a clock having (R+11) pulses per sample period. The output of register 314, which is the tone control output, is (MS$-$A) or MS (G$-$(2$-$1)/$-2^{-5}$)/(1+(2$-$1)/$2^{-5}$) delayed one sample period.

In arriving at the foregoing results the effect of register 309 was ignored and this may be justified as follows. The input signal is a time division multiplexed siqnal having the sequence of samples $L_{n-1}$, $R_{n-1}$, $L_n$, $R_n$, $L_{n+1}$, $R_{n+1}$ etc. Assume all the circuitry elements in FIG. 6 have been reset to zero. During the first sample period, sample $L_{n-1}$ is coupled to the gain element 250. At the end of the first sample period a scaled version of the sample $L_{n-1}$ is resident in register 309 and register 306 is loaded with a zero value. During the second sample period the sampel $R_{n-1}$ is coupled to the gain element 250 and the scaled $L_{n-1}$ sample in register 309 is clocked into register 306. At the end of the second sample period the scaled $L_{n-1}$ sample is resident in register 306 and the scaled $R_{n-1}$ sample is resident in register 309. During the third sample period sample $L_n$ is applied to the gain element 250 and a processed version of sample $L_{n-1}$ from register 306 is combined with the sample $L_n$ in combining element 268 and in adder 260. Concurrently the scaled sample $R_{n-1}$ in register 309 is closed into register 306 and processed sample $(L_{n-l},L_n)$ from gain element 250 is loaded into register 309. During the next sample period, sample $R_n$ is coupled to gain element 250 and a processed version of the sample $R_{n-1}$ from register 306 is combined with the sample $R_n$ in combining element 268 and in adder 260. Concurrently the processed sample ($L_{n-1}$, $L_n$) from register 309 is clocked into register 306 and a processed sample ($R_{n-1},R_n$) from gain element 250 is loaded into register 309 and so forth. The interposition of the register 309 serves to maintain the components of the multiplexed signal separate but does not affect the transfer function of the system vis a vis the separate signal components. Alternatively, for a single component signal the transfer function (MS-A)/MS would change to (MS$-$A)/MS=(G+($Z^2-1$)/$2^{-5}$)/(1+($Z^2-1$)/$2^{-5}$).

What is claimed is:
1. Tone control apparatus comprising:
   a system input terminal and a system output terminal;
   signal combining means having a first input terminal and an output terminal respectively coupled to said system input and said system output terminals, and having a second input terminal;
   a gain element having input, control and output terminals for multiplying signal applied to its input terminal by a factor (G$-$1) responsive to control signals applied to said control terminal, where G is a variable gain factor;
   means for selectively coupling said system input terminal or said system output terminal to the input terminal of said gain element;

circuitry, having a transfer function T given by $T=K/[Z-1+K]$, coupled between said gain element and the second input terminal of said signal combining means, where K is a scaler constant and Z is the conventional Z-transform variable 2. The tone control apparatus set forth in claim 1 wherein said circuitry having the transfer function T, comprises:
   a delay element for providing delayed signals, having an input and an output terminal;
   means for combining signal applied to said circuitry and said delayed signals with the negative of K times said delayed signals, and applying the combined signal to the input terminal of said delay element; and
   scaling means coupled to the output terminal of said delay element for scaling signal by the constant K.

3. A tone control system comprising:
   a system input and a system output terminal;
   a signal adder having a first and second input terminal and an output terminal;
   respective means for coupling the first input terminal of said adder to the system input terminal and for coupling the output terminal of said adder to the system output terminal;
   multiplier circuitry, having a signal input, control signal input and output terminals for multiplying applied signal by a variable determined by a control signal applied to said control signal input terminal;
   a signal subtracter and a further signal adder coupled in cascade and in series with the output terminal of said multiplier circuitry;
   a delay element coupled to the output of said further signal adder said delay element having an output terminal coupled to an input terminal of said further adder;
   signal scaling means, having an input terminal coupled to the output terminal of said delay element, and having an output terminal for scaling signal applied thereto by a constant;
   respective means for coupling the output terminal of said scaling means to a second input of said signal subtracter and to the second input terminal of said signal adder; and
   means for selectively coupling said system input terminal or said system output terminal to the signal input terminal of said multiplier circuitry.

4. The system set forth in claim 3 wherein said multiplier circuitry comprises:
   a further signal subtracter having minuend and subtrahend input terminals, and having an output terminal corresponding to the output terminal of said multiplier circuitry;
   a multiplier having input, output and control terminals;
   means for coupling the input and output terminals of said multiplier to the multiplier circuitry signal input terminal and the minuend input terminal of said further signal subtracter respectively; and
   means for coupling the subtrahend input terminal of said further signal subtracter to the signal input terminal of said multiplier circuitry.

5. A tone control system comprising:
   a system input and a system output terminal;
   an adder having a first input and an output terminal coupled respectively to said system input and output terminals, and having a second input terminal;
   circuitry having an output terminal coupled to the second input terminal of said adder, having a control input terminal and a signal input terminal and including the cascade combination of a variable gain element and an integrator and wherein said control input terminal is coupled to said variable gain element;
   means for selectively coupling said system input terminal or said system output terminal to the signal input terminal of said circuitry, the transfer function from said system input to said system output terminal, having a fixed pole and a variable zero controlled by a control signal applied to said variable gain element, when the system input terminal is coupled to said circuitry, and the transfer function from said system input to said system output terminal, having a fixed zero and a variable pole controlled by said control signal applied to said variable gain element when the system output terminal is coupled to said circuitry.

6. A serial-bit sampled data tone control system comprising:
   a sysem input and a system output terminal;
   combining means having a first input and an output terminal coupled responsively to said system input and output terminals, and having a second input terminal;
   a serial-bit gain element, having input, output and control input terminals, for scaing signals applied to its terminal by factors corresponding to control signal applied to its said control input terminal;
   means for coupling the input terminal of said serial-bit gain element to said system input terminal;
   shift register means for delaying samples by a multiple, including one, of sample periods, having an input terminal coupled to the output terminal of said serial-bit gain element and an output terminal coupled to the second input terminal of said combining means; and
   means coupled between the output and input terminals of said shift register means for scaling output signal from said shift register means by a factor $W(K-1)$ and coupling scaled output signal from said shift register means to the input terminal of said shift register means, where W, and K are non zero constants.

7. The serial-bit sampled data tone control apparatus set forth in claim 6 wherein said means for coupling the input terminal of said serial-bit gain element to said system input terminal comprises means for selectively coupling said system input terminal or the output terminal of said combining means to the input terminal of said serial-bit gain element.

8. The serial-bit sampled data tone control apparatu set forth in claim 6 wherein said serial-bit gain element includes cascade connection of delay elements and combining elements each of which provides signal delays of integral numbers of bit periods and means coupled to the input terminal of said serial-bit gain element for selectively coupling signal samples to ones of said combining means.

9. Tone control apparatus comprising
   a system input and a system output terminal;
   combining means having input and output terminals coupled respectively to said system input and system output terminals, and having a second input terminal;

processing means having an output terminal coupled to the second input terminal of said combining means, having an input and control terminals, and exhibiting a transfer function T between its input and output terminals of $$T=W(G-1)K/(Z-1+K)$$

where W and K are constants, G is a variable corresponding to control signal applied to said control terminal and Z is the conventional Z-transform variable; and means for coupling the input terminal of said processing means to said system input terminal.

10. The tone control apparatus set forth in claim 9 wherein the means for coupling the input terminal of said processing means to said system input terminal includes means for alternatively coupling the output terminal of said combining means to the input terminal of said processing means.

* * * * *

UNITED STATES PATENT AND TRADEMARK OFFICE
CERTIFICATE OF CORRECTION

PATENT NO. : 4,764,967

DATED : Aug. 16, 1988

INVENTOR(S) : Todd J. Christopher

It is certified that error appears in the above-identified patent and that said Letters Patent is hereby corrected as shown below:

Column 8, line 9, that portion reading "If the control signals ..." should begin a new paragraph; line 66, that portion reading "229" should read -- 269 --; Column 9, line 10, that portion reading "FGIURE" should read -- FIGURE --; Column 10, line 14, that portion reading "$(G-(2-1)/-2^{-5})/(1+(2-1)/2^{-5})$" should read -- $(G-(Z-1)/2^{-5})/(1+(Z-1)/2^{-5})$ --; line 37, that portion reading "closed" should read -- clocked --; Column 12, line 30, that portion reading "scaing" should read -- scaling --; line 55, that portion reading "apparatu" should read -- apparatus --.

Signed and Sealed this

Seventh Day of February, 1989

Attest:

DONALD J. QUIGG

Attesting Officer     Commissioner of Patents and Trademarks